(12) United States Patent
Balcom et al.

(10) Patent No.: US 12,094,988 B1
(45) Date of Patent: Sep. 17, 2024

(54) P-TYPE CZT RADIATION DETECTOR FOR HIGH FLUX APPLICATIONS

(71) Applicant: REDLEN TECHNOLOGIES, INC., Saanichton (CA)

(72) Inventors: James Balcom, North Saanich (CA); Jason MacKenzie, Victoria (CA); Francis Joseph Kumar, Victoria (CA); Krzysztof Iniewski, Port Moody (CA); Michael K. Jackson, Victoria (CA); Yuxin Song, Saanichton (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 31 days.

(21) Appl. No.: 17/807,957

(22) Filed: Jun. 21, 2022

Related U.S. Application Data

(60) Provisional application No. 63/213,979, filed on Jun. 23, 2021.

(51) Int. Cl.
*H01L 31/0272* (2006.01)
*H01L 31/0288* (2006.01)
*H01L 31/08* (2006.01)
*H01L 31/109* (2006.01)

(52) U.S. Cl.
CPC ...... *H01L 31/0272* (2013.01); *H01L 31/0288* (2013.01); *H01L 31/085* (2013.01); *H01L 31/109* (2013.01)

(58) Field of Classification Search
CPC ............. H01L 31/0272; H01L 31/0288; H01L 31/085; H01L 31/109; H01L 27/14676
See application file for complete search history.

(56) References Cited

U.S. PATENT DOCUMENTS

| 9,018,589 | B2 | 4/2015 | Engel et al. | |
| 2007/0206721 | A1* | 9/2007 | Tkaczyk | G01T 1/249 |
| | | | | 378/19 |
| 2013/0256541 | A1* | 10/2013 | Engel | H01L 31/18 |
| | | | | 438/57 |
| 2015/0364633 | A1* | 12/2015 | Hosomi | H01L 31/068 |
| | | | | 136/255 |
| 2020/0411706 | A1* | 12/2020 | Hirashita | H01L 31/022408 |
| 2021/0011180 | A1* | 1/2021 | Yamada | H01L 31/0224 |
| 2021/0111252 | A1* | 4/2021 | Yamada | H01L 31/02966 |

OTHER PUBLICATIONS

Prokesch, M. et al., "CdZnTe detectors for gamma spectroscopy and x-ray photon counting at 250×106 photons/(mm2 s)," Journal of Applied Physics, vol. 124, pp. 044503-1 044503-8, (2018); https://doi.org/10.1063/1.5041006.

Prokesch, M. et al., "Effect of temperature- and composition-dependent deep level energies on electrical compensation: Experiment and model of the Cd1-xZnxTe system," Physical Review B, vol. 75, No. 24, pp. 245204-245204, (2007); DOI:10.1103/PHYSREVB.75.245204.

Proprietary Information Disclosure Statement.

* cited by examiner

*Primary Examiner* — Calvin Y Choi
(74) *Attorney, Agent, or Firm* — THE MARBURY LAW GROUP PLLC

(57) ABSTRACT

An ionizing radiation detector includes a p-type semiconductor single crystal substrate having first and second major planar opposing surfaces, where the p-type semiconductor single crystal substrate is doped with n-type dopant atoms, and where a concentration of deep level acceptor defects is greater than a concentration of the n-type dopant atoms in the p-type semiconductor single crystal substrate; a cathode electrode on the first major planar opposing surface of the p-type semiconductor single crystal substrate, and a plurality of anode electrodes on the second major planar opposing surface of the p-type semiconductor single crystal substrate.

14 Claims, 13 Drawing Sheets

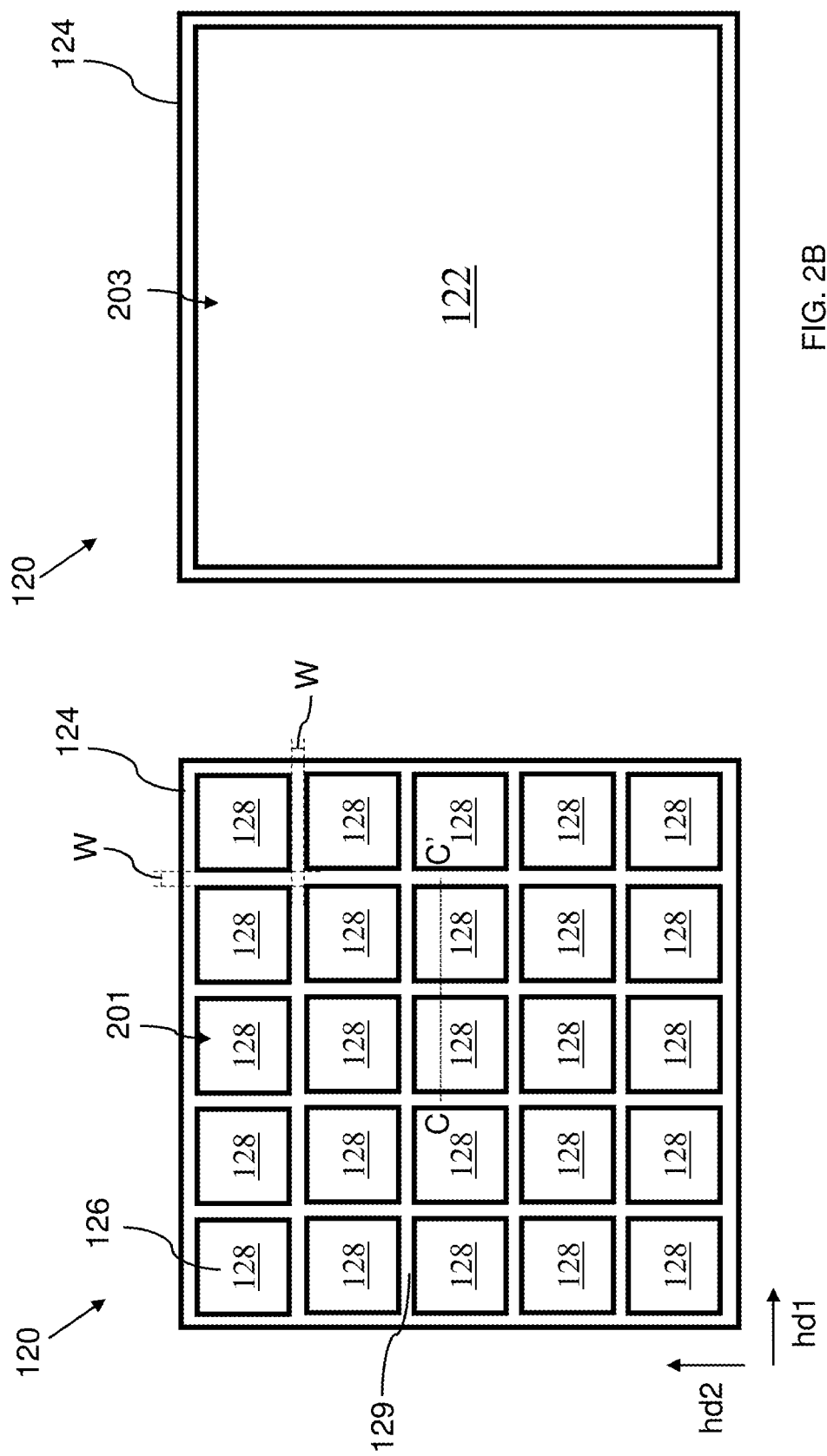

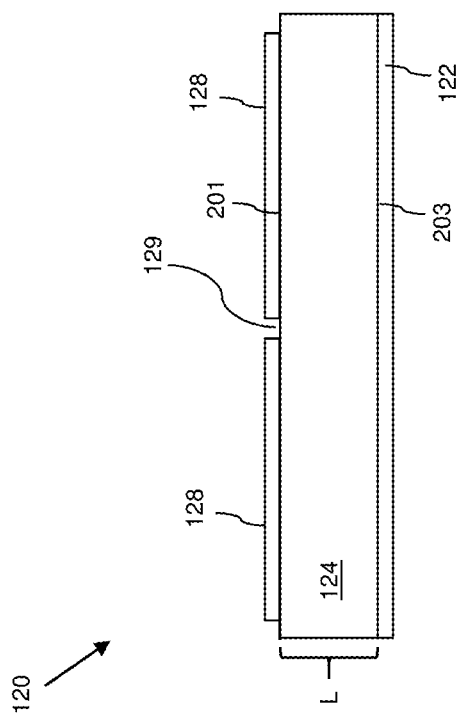

P-TYPE CZT RADIATION DETECTOR FOR HIGH FLUX APPLICATIONS

FIELD

The present application relates generally to ionizing radiation detectors, such as photon counting computed tomography (PCCT) radiation detectors, and to imaging systems using ionizing radiation detectors.

BACKGROUND

In typical photon counting X-ray computed tomography (CT) imaging systems, the charge cloud resulting from an X-ray photon impinging on a sensor is converted to an amplified voltage by a charge sensitive amplifier (CSA). The voltage output of the CSA is compared against a number of user-settable thresholds. Each threshold level is associated with a counter, such that each counter represents an energy bin representing the energy range between two adjacent thresholds. A drawback to such detector systems is that they can experience a loss of performance due to electrical polarization during high-flux applications.

SUMMARY

According to one embodiment, an ionizing radiation detector includes a p-type semiconductor single crystal substrate having first and second major planar opposing surfaces, where the p-type semiconductor single crystal substrate is doped with n-type dopant atoms, and where a concentration of deep level acceptor defects is greater than a concentration of the n-type dopant atoms in the p-type semiconductor single crystal substrate; a cathode electrode on the first major planar opposing surface of the p-type semiconductor single crystal substrate, and a plurality of anode electrodes on the second major planar opposing surface of the p-type semiconductor single crystal substrate.

BRIEF DESCRIPTION OF THE DRAWINGS

The accompanying drawings are presented to aid in the description of embodiments of the disclosure and are provided solely for illustration of the embodiments and not limitation thereof.

FIGS. 2A and 2B are front and rear views of an ionizing radiation detector according to an embodiment of the present disclosure.

FIG. 2C is a side cross-sectional view of the ionizing radiation detector along plane C-C' in FIG. 2A.

DETAILED DESCRIPTION

In various embodiments, an n-type atom doped single-crystal semiconductor material, such as indium-doped cadmium zinc telluride (CZT), contains sufficient p-type compensating defects as to render the semiconductor material a p-type single-crystal semiconductor material. In particular, the number of intrinsic deep level donor defects in the material may be suppressed and the number of intrinsic deep level acceptor defects present in the material may exceed the total number of extrinsic (i.e., dopant) donor defects and intrinsic donor defects present in the material. In various embodiments, the majority of the carrier trap defects in the semiconductor material may be acceptor impurities (which may also be referred to as "acceptor defects" and/or "hole traps"), and thus the material may be a p-type semiconductor material. In various embodiments, an X-ray radiation detector having a p-type semiconductor material substrate, such as a p-type but indium-doped CZT material substrate, may operate properly under high X-ray flux conditions without undergoing detector polarization.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims. Any reference to claim elements in the singular, for example, using the articles "a," "an," or "the" is not to be construed as limiting the element to the singular. The terms "example," "exemplary," or any term of the like are used herein to mean serving as an example, instance, or illustration. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

Figure 1:
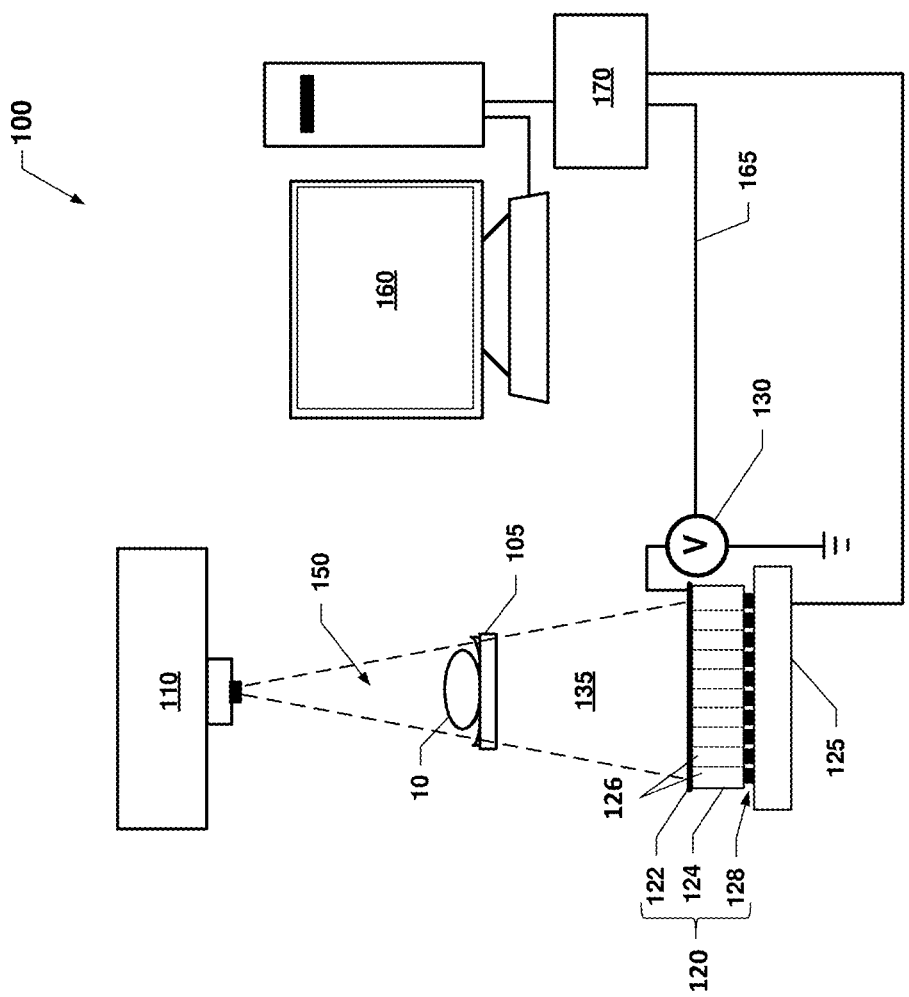
FIG. 1 is a block diagram of an imaging system suitable for use with various embodiments of the present disclosure.

FIG. 1 is a functional block diagram of an example ionizing radiation imaging system in accordance with various embodiments. The illustrated example ionizing radiation imaging system is a CT imaging system 100 that includes an X-ray source 110 (i.e., a source of ionizing radiation), and a radiation detector 120. The CT imaging system 100 may additionally include a support structure 105, such as a table or frame, which may rest on the floor and may support an object 10 to be scanned. The support structure 105 may be stationary (i.e., non-moving) or may be configured to move relative to other elements of the CT imaging system 100. The object 10 may be all or a portion of any biological (e.g., human patient) or non-biological (e.g., luggage) object to be scanned.

The X-ray source 110 is configured to deliver ionizing radiation to the radiation detector 120 by emitting an X-ray beam 135 toward the object 10 and the radiation detector 120. After the X-ray beam 135 is attenuated by the object 10, the beam of radiation 135 is received by the radiation detector 120. The radiation detector 120 includes at least one anode 128 and cathode 122 pair separated by a semiconductor material plate (e.g., semiconductor substrate) 124.

The radiation detector 120 may be controlled by a high voltage bias power supply 130 that selectively creates an electric field between an anode 128 and cathode 122 pair separated by a semiconductor material plate 124. The semiconductor material plate 124 may comprise any suitable semiconductor material for detecting X-ray radiation disposed between the anode 128 and cathode 122 and thus configured to be exposed to the electrical field therebetween. In various embodiments, the semiconductor material plate 124 may comprise a II-VI semiconductor material, such as cadmium telluride, cadmium zinc telluride (i.e., CdZnTe or "CZT"), cadmium selenide telluride, and cadmium zinc selenide telluride. Other suitable semiconductor materials are within the contemplated scope of disclosure.

In some embodiments, there may be a plurality of separate CZT pixels 126 (e.g., 4 to 1024, such as 256 to 864 pixels for example) in the semiconductor material plate 124, each containing and electrically connected to a separate anode 128. One or more cathodes 122 are provided for the plurality of CZT pixels 126. A read-out application specific integrated circuit (ASIC) 125 coupled to the anode(s) 128 and cathode 128 pair may receive signals (e.g., charge or current) from the anode(s) 128 and be configured to provide data to and by controlled by a control unit 170.

The control unit 170 may be configured to synchronize the X-ray source 110, the read-out ASIC 125, and the high voltage bias power supply 130. The control unit 170 may be coupled to and operated from a computing device 160. Alternatively, the computing device 160 and the control unit 170 may be integrated together as one device.

The object 10 may pass between the X-ray source 110 and the radiation detector 120 or alternatively the object may remain stationary while the X-ray source 110 and the radiation detector 120 move relative to the object 10. Either way, the radiation detector 120 may capture incremental cross-sectional profiles of the object 10. The data acquired by the radiation detector 120 may be passed along to the computing device 160 that may be located remotely from the radiation detector 120 via a connection 165. The connection 165 may be any type of wired or wireless connection. If the connection 165 is a wired connection, the connection 165 may include a slip ring electrical connection between any structure supporting the radiation detector 120 and a stationary support part of the support structure 105, which supports any part (e.g., a rotating ring). If the connection 165 is a wireless connection, the radiation detector 120 may contain any suitable wireless transceiver to communicate data with another wireless transceiver that is in communication with the computing device 160. The computing device 160 may include processing and imaging applications that analyze each profile obtained by the radiation detector 120, and a full set of profiles may be compiled to form two-dimensional images of cross-sectional slices of the object 10.

Various alternatives to the design of the CT imaging system 100 of FIG. 1 may be employed to practice embodiments of the present disclosure. CT imaging systems may be designed in various architectures and configurations. For example, a CT imaging system may have a helical architecture. In a helical CT imaging scanner, the X-ray source and detector array are attached to a freely rotating gantry. During a scan, a table (i.e., support structure 105) moves the object 10 smoothly through the scanner creating helical path traced out by the X-ray beam. Slip rings enable the transfer of power and data on and off the rotating gantry. In other embodiments, the CT imaging system may be a tomosynthesis CT imaging system. In a tomosynthesis CT scanner, the gantry may move in a limited rotation angle (e.g., between 15 degrees and 60 degrees) in order to detect a cross-sectional slice of the object. The tomosynthesis CT scanner may be able to acquire slices at different depths and with different thicknesses that may be constructed via image processing. In other embodiments, multiple X-ray sources are disposed at different angles with respect to the detector array. The X-ray sources are turned on sequentially, forming a series of transmission images through the object to be scanned. An image is then reconstructed without requiring any motion of X-ray sources and the detector array.

The detector array of a CT imaging system may include an array of radiation detector elements, referred to herein as pixel detectors. The signals from the pixel detectors may be processed by a pixel detector circuit, which may sort detected photons into energy bins based on the energy of each photon or the voltage generated by the received photon. When an X-ray photon is detected, its energy is determined and the X-ray photon count for its associated energy bin is incremented. For example, if the detected energy of an X-ray photon is 24 kilo-electron-volts (keV), the X-ray photon count for the energy bin of 20-40 keV may be incremented. The number of energy bins may range from one to several, such as two to six. In an illustrative example, an X-ray photon counting detector may have four energy bins: a first bin for detecting photons having an energy between 20 keV and 40 keV, a second bin for detecting photons having an energy between 40 keV and 60 keV, a third bin for detecting photons having an energy between 60 keV and 80 keV, and a fourth bin for detecting photons having an energy above 80 keV. The greater the total number of energy bins, the better the material discrimination.

In CT imaging systems, a scanned object is exposed to an X-ray beam and attenuated photons from the X-ray beam are detected and counted by individual radiation detector pixels in a detector array. When an object (e.g., the object 10) is loaded in a CT imaging system, the X-ray beam may be heavily attenuated, and the number of photons detected by the detector array may be orders of magnitude less than the number of photons emitted from an X-ray source. For image reconstruction purposes, the radiation detector can be exposed to a direct X-ray beam without an intervening object located inside the CT imaging system. In such cases, the X-ray photon count rates in the CT imaging system may reach values of 100 million counts per second per square millimeter (Mcps/mm$^2$) or more. The detector array should be capable of detecting such a wide range of photon count rates.

FIGS. 2A-2C schematically illustrate a radiation detector (such as a photon counting computed tomography radiation detector) 120 for an imaging system, such as a CT imaging system 100 as shown in FIG. 1. FIG. 2A illustrates a first (e.g., anode) side 201 of the radiation detector 120, and FIG. 2B illustrates a second (e.g., cathode) side 203 of the radiation detector 120, opposite the first side 201. FIG. 2C illustrates a side cross-sectional view along plane C-C' in FIG. 2A. The radiation detector 120 includes a semiconductor material substrate 124 (e.g., semiconductor wafer), such as a cadmium zinc telluride (CZT) substrate. Anode and cathode electrodes 128, 122 may be located over the semiconductor material substrate 124 on the first 201 and second 203 sides of the detector 120, respectively.

As shown in FIG. 2A, the first side 201 of the radiation detector 120 may include an array of discrete anode electrodes 128 comprised of an electrically conductive material, with gaps 129 between adjacent anode electrodes 128. Each anode electrode 128 may define a separate detector element (i.e., a pixel 126) of the radiation detector 120. As discussed above, a detector circuit, such as an application specific integrated circuit (ASIC) 125 shown in FIG. 1, may be coupled to the anode electrodes 128 and may be configured to read out electric signals (e.g., charge or current) for each pixel 126 of the radiation detector 120. The gaps 129 between the adjacent anode electrodes 128 may also be referred to as "streets" or "roads." The "streets" 129 may be arranged in a regular grid pattern, as shown in FIG. 2A. Other geometries for the anode electrodes 128 and the streets 129 are within the contemplated scope of this disclosure, including anode electrodes 128 having non-uniform and/or non-rectangular shapes (e.g., triangular, elliptical and/or irregularly shaped anodes), as well as streets 129 having non-uniform spacing and/or widths.

Referring to FIG. 2B, the second side 203 of the radiation detector 120 may include a cathode electrode 122 comprised of an electrically conductive material. In the embodiment shown in FIG. 2B, the cathode electrode 122 may be a monolithic cathode electrode, meaning that a single cathode electrode 122 extends continuously over the surface of the semiconductor material substrate 124 located opposite to the first side 201 of the radiation detector 120. Alternately, the cathode electrode 122 may include a plurality of discrete segments of conductive material over the surface of the semiconductor material substrate 124, where each segment may correspond to a subset of one or more pixels 126 of the pixel array.

In some embodiments, the semiconductor material substrate 124 of the radiation detector 120 may be composed of a II-VI semiconductor material, such as cadmium telluride, CdTe, or another cadmium telluride-based material. The semiconductor material may include a zinc blende crystal structure in which the two atom types (e.g., Cd and Te) form two interpenetrating face centered cubic (FCC) lattices. In the case of a CdTe-based material, each sub-lattice of Cd and Te atoms may be displaced one-quarter of the way along the main diagonal of the other, resulting in an asymmetrical crystal structure. In some embodiments, a CdTe-based material as described above may further include zinc to provide cadmium zinc telluride (i.e., CdZnTe, or "CZT"). In various embodiments, the semiconductor material may include between 6-14 at. % of zinc, such as between 9-11 at. % (e.g., 10 at. %) of zinc. The zinc atoms may substitute on cadmium atom positions in the crystal structure.

The addition of zinc to CdTe increases the band gap of the material. The wider band gap provides a higher maximum resistivity of the ternary compound. For CdZnTe with 10% Zn, the band gap increases from 1.5 eV to 1.6 eV and the maximum achievable resistivity increases by a factor of three, typically from $2 \times 10^{10}$ Ohm-cm for CdTe to $6 \times 10^{10}$ Ohm-cm for CdZnTe. A higher resistivity may be important for attaining sufficient carrier depletion of the semiconductor crystal and to realize active detector thickness in the few mm to few cm range, and to maintain a high electric field across the detector with low leakage current. Insufficiently low depletion may limit the active depth of the device and the energy range of the detector, while excessive leakage current produces electronic noise that may deteriorate the energy resolution of the detector.

Another difference between CdTe and CZT derives from the different chemical properties of CdTe and ZnTe. ZnTe has a lower ionicity and a higher binding energy than CdTe, and the bond length is shorter in ZnTe. Thus, the CdTe lattice may be strengthened by the incorporation of Zn, leading to an increase of the shear modulus and solution hardening of the ternary compound. The solution hardening of CdZnTe reduces the propensity for plastic deformation and the formation of dislocations; however, it also reduces dislocation motion and makes the ternary compound more brittle than CdTe.

A further difference stems from the chemical potentials of the two material systems. The addition of Zn increases the maximum deviation from stoichiometry in CdZnTe on the Te-rich side of the phase diagram. This is because, in thermal equilibrium, Cd and Zn vacancies are the dominant native defects in CdTe and CdZnTe, and excess Te is primarily accommodated by an increase in the number of vacancies in the lattice. The higher maximum Te solubility in CdZnTe therefore indicates that the formation energy of the Cd (and Zn) vacancy is reduced in CdZnTe relative to CdTe.

The semiconductor material for X-ray radiation detectors, such as the detector 120 shown in FIGS. 1-2C, is preferably formed as a high-quality, single-crystal semiconductor material. Various techniques may be used to form the single-crystal semiconductor material. In the case of CZT materials, for example, single-crystal CZT material may be formed (i.e., grown) by directional solidification from their melts or from solution. In melt growth techniques, the constituent materials (e.g., CdTe and CdZn) may be melted at a few degrees above their melting points and then very slowly solidified in a temperature gradient. The solution growth process is very similar, except that the melt is enriched in one of the constituents to form a solution from which the material crystallizes at a lower temperature. The most often used techniques for the growth of CZT single crystals are the Bridgman, gradient freeze, and electro-dynamic gradient freeze melt-growth processes and the traveling heater method (THM), which is a solution growth technique.

The single crystal CZT material may solidify to form a solid boule that may grow along a particular crystal orientation. For example, a single crystal CZT boule may grow predominantly along the <111> crystal orientation. The solidified boule may then be sliced to form a plurality of wafers. The slicing of the boule may be along a particular crystal plane such as the {100}, {110} and {111} planes. In one embodiment, a single crystal CZT boule may be grown in the (111) B direction and sliced to have (111) A and B plane major surfaces.

The semiconductor material for the radiation detector, such as a II-VI semiconductor material (e.g., a CdTe-based material, including CZT) is typically also doped using suitable dopant atoms to provide impurities that may modify the electrical properties of the material. The quantity of the dopant material(s) that is added may be relatively small, such as between 0.1 to 20 parts per million (ppm) (e.g., 1-8 ppm). The dopant material(s) may be added during crystal growth, or may be added at the wafer fabrication stage by means of ion implantation or diffusion. The dopant atoms may take either interstitial or substitutional sites by displacing a host atom from its lattice position in the crystal structure of the semiconductor material. Impurity defects in the semiconductor material generated by the intentional addition of a dopant may be referred to as "intentional extrinsic impurities."

Figure 3:
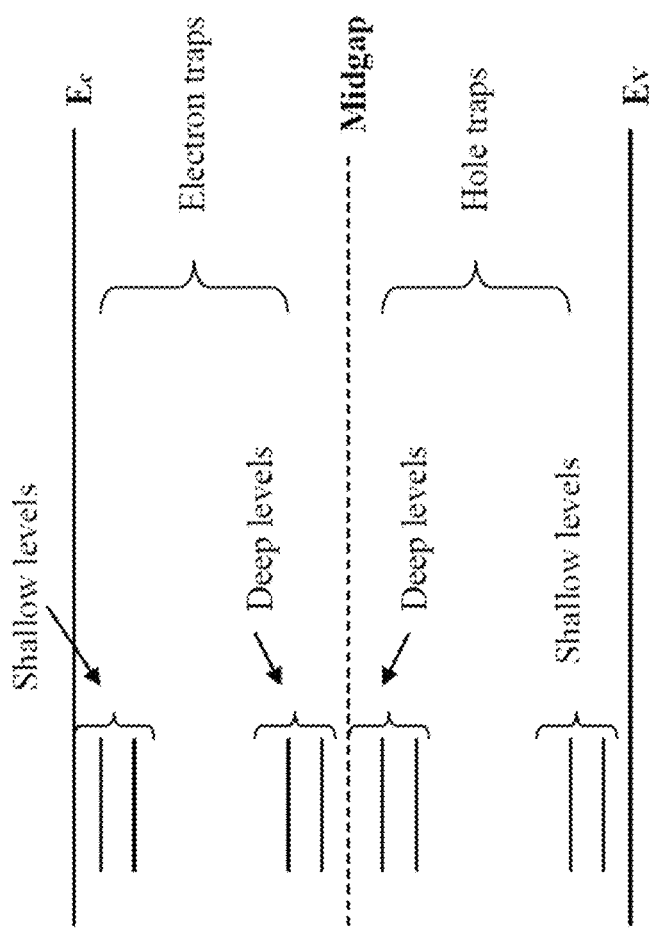
FIG. 3 is an energy band diagram schematically illustrating energy levels of a semiconductor material for an ionizing radiation detector.

In many cases, the dopants added to the semiconductor material of the radiation detector, such as CZT, are "n-type" dopants. In the case of CZT, indium may be added as an n-type dopant, although other suitable n-type dopants are within the contemplated scope of disclosure. As used herein, an "n-type" dopant is a dopant atom that creates extra electron energy states near the conduction band, $E_c$, of the host semiconductor material. These localized energy states may also be referred to as "donor impurities," "donor defects," and/or "electron traps." This is schematically illustrated in the energy diagram of FIG. 3. These impurities created by n-type dopants that are proximate to the conduction band, $E_c$, may also be referred to as "shallow donor defects." In a conventional CZT-based detector, the CZT material is doped using an n-type dopant (e.g., indium) and is an "n-type" semiconductor material, meaning that the majority of the carrier trap defects in the material are electron traps, as opposed to "hole traps" (which may also be referred to as "acceptor impurities" and/or "acceptor defects").

Referring again to FIGS. 1 and 2C, a conventional radiation detector 120 comprised of an n-type semiconductor material substrate 124 (e.g., n-type CZT) may be coupled to a high voltage bias power supply 130 such that a high voltage (HV), which may have a negative polarity, may be applied to the cathode-side 203 of the semiconductor material substrate 124 (e.g., to the cathode 122). The anode-side 201 of the semiconductor material substrate 124 may be connected via the anodes 128 to virtual ground in the ASIC 125. Upon the application of the high voltage (HV), a depletion of charge carriers (i.e., electrons) begins at the cathode-side 203 of the substrate 124 and progresses towards the anode-side 201. The width of the depletion region of the semiconductor material substrate 124 is, in part, a function of the magnitude of the bias voltage (HV). A depletion voltage, $V_{dep}$, may be defined as the minimum bias voltage (HV) required to deplete the entire thickness, L, of the semiconductor material substrate 124. Where the bias voltage HV is less than the depletion voltage, $V_{dep}$, the depletion is incomplete, and the detector 120 does not operate properly to detect X-ray radiation. Thus, in general, the bias voltage (HV) may preferably be equal to or greater than the depletion voltage, $V_{dep}$, of the semiconductor material substrate 124 having a given thickness, L, and doping concentration.

Figure 4A:
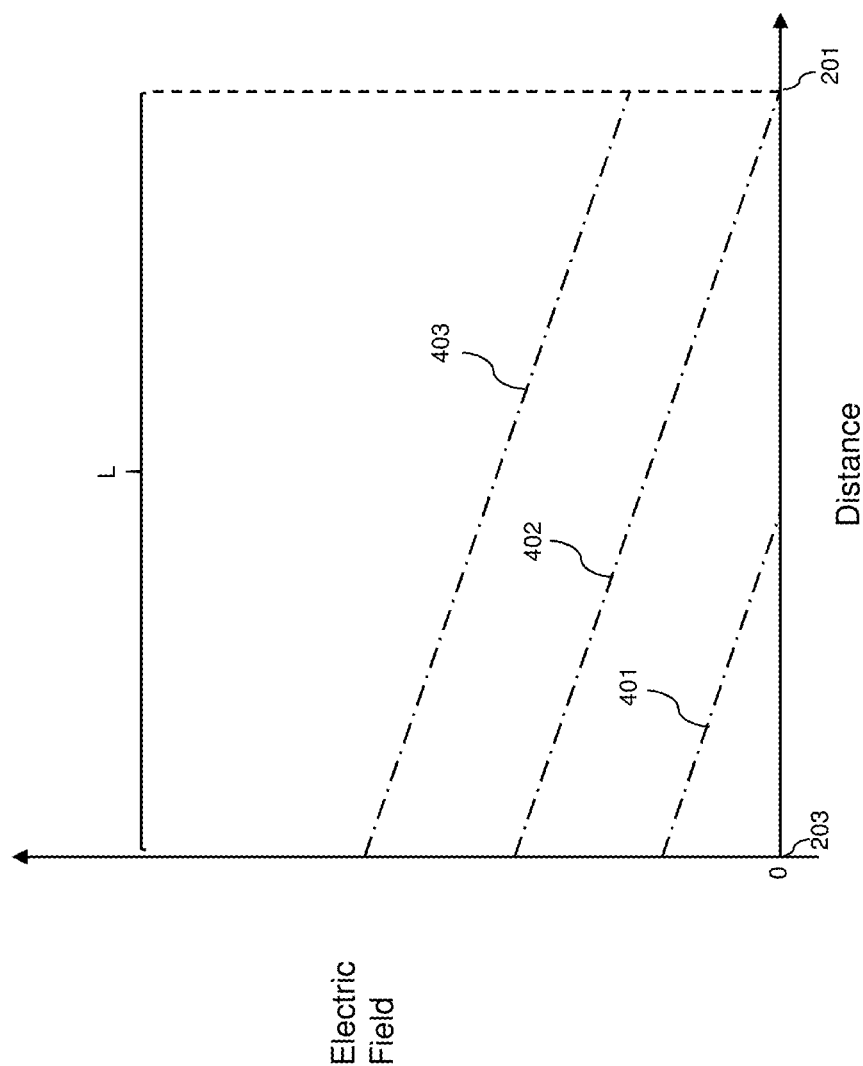
FIG. 4A is a plot schematically illustrating the electric field distribution within an n-type semiconductor material substrate of a detector between the cathode-side and the anode-side of the substrate following the application of different bias voltages and prior to exposing the substrate to ionizing radiation.

FIG. 4A is a plot schematically illustrating the electric field distribution within the n-type semiconductor material substrate 124 between the cathode-side 203 and the anode-side 201 of the substrate 124 following the application of different bias voltages (HV), and prior to exposing the substrate 124 to ionizing (e.g., X-ray) radiation. As shown in FIG. 4A, for all three bias voltages 401, 402, 403, the magnitude of the electric field is largest at the cathode-side 203 of the semiconductor material substrate 124 and decreases towards the anode-side 201. Dashed line 401 illustrates an instance in which the bias voltage (HV) is less than the depletion voltage, $V_{dep}$, and shows that the electric field decreases to zero at a distance from the cathode-side 203 that is less than the total thickness, L, of the substrate 124. In this instance, the width of the depletion zone is less than the total thickness, L, and the detector does not operate properly. Dashed line 402 illustrates the case in which the bias voltage (HV) is equal to the depletion voltage, $V_{dep}$, and shows that the electric field gradually decreases to ~0 V/m at the anode-side 201 of the substrate 124. Dashed line 403 illustrates an instance in which the bias voltage (HV) is greater than the depletion voltage, $V_{dep}$, and shows that the electric field gradually decreases to a non-zero electric field at the anode-side 201 of the substrate 124. In the instances shown in lines 402 and 403, the semiconductor material substrate 124 is fully depleted.

Figure 4B:
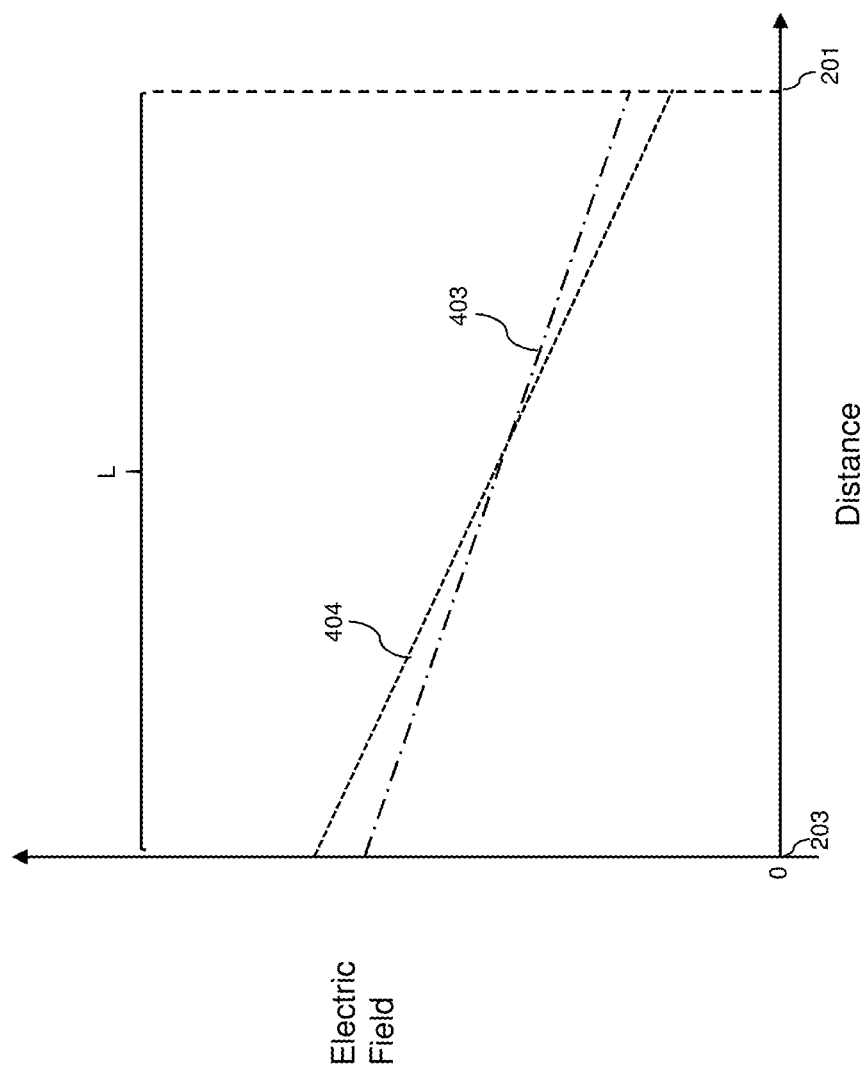
FIG. 4B is a plot schematically illustrating the electric field distribution within an n-type semiconductor material substrate of a detector between the cathode-side and the anode-side of the substrate before and during an exposure to X-ray radiation.

FIG. 4B is a plot schematically illustrating the electric field distribution within the n-type semiconductor material substrate 124 between the cathode-side 203 and the anode-side 201 of the substrate 124 before and during an exposure to X-ray radiation. Dashed line 403 is identical to dashed line 403 in FIG. 4A, and shows the electric field distribution prior to radiation exposure where $HV > V_{dep}$. Dashed line 404 shows the electric field distribution while the substrate 124 is being exposed to moderate flux X-ray radiation (e.g., ≤20 Mcps/mm$^2$). During X-ray exposure, X-ray photons absorbed within the depletion region of the semiconductor material substrate 124 result in the generation of electron-hole pairs. The electrons drift towards the anode-side 201 while the holes drift towards the cathode-side 203 due to the externally applied bias voltage (HV). The trapping of photogenerated holes leads to a positive increase of fixed space charge close to the cathode 203. The positive accumulated charge leads to a weakening of the electric field proximate to the anode-side 201 while increasing the electric field proximate to the cathode-side 203. This effect may be explained using Poisson's equation, where it may be shown that the integral of the electric field over the detector volume must remain equal to the bias voltage (HV). As shown in FIG. 4B, the electric field near the cathode-side 203 is higher during X-ray exposure (line 404) than prior to the X-ray exposure (line 403) and the electric field near the anode-side 201 is lower during X-ray exposure (line 404) than prior to X-ray exposure (line 403).

Figure 4C:
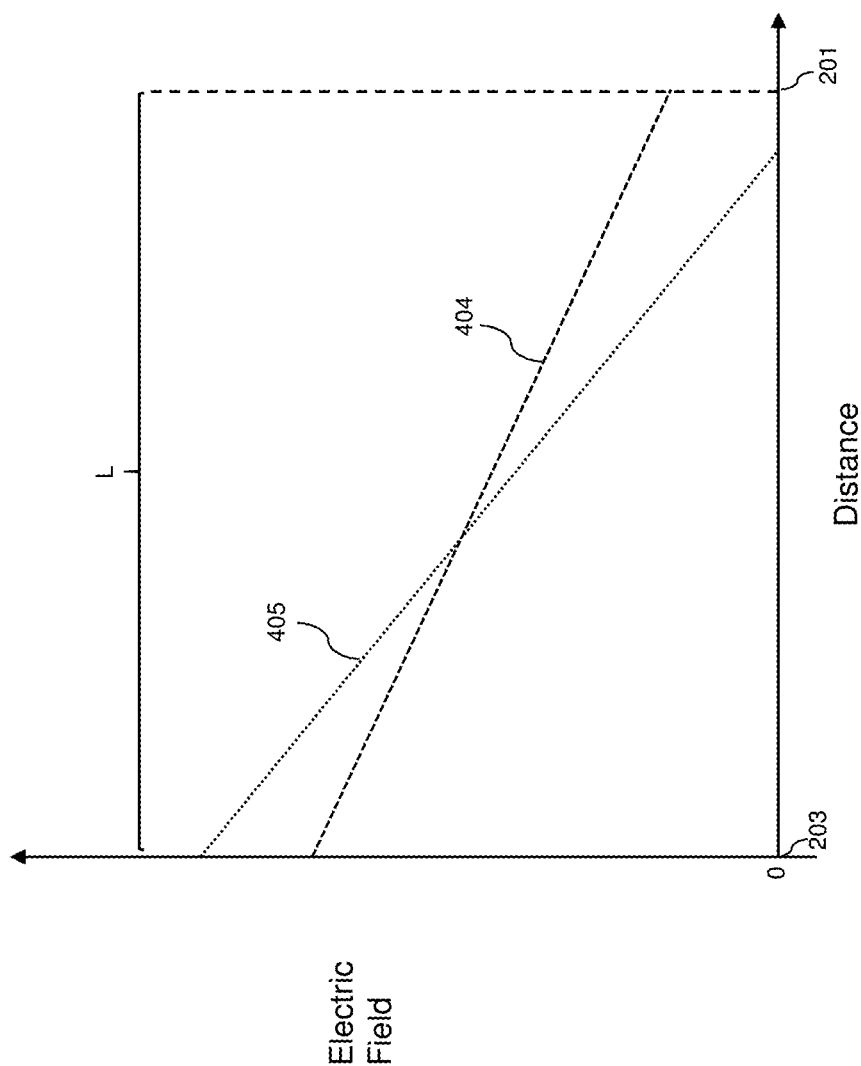
FIG. 4C is a plot schematically illustrating the electric field distribution within an n-type semiconductor material substrate of a detector between the cathode-side and the anode-side of the substrate during exposure to high-flux X-ray radiation.

FIG. 4C is a plot schematically illustrating the electric field distribution within the n-type semiconductor material substrate 124 between the cathode-side 203 and the anode-side 201 of the substrate 124 during exposure to different X-ray radiation flux rates. Line 404 is identical to line 404 in FIG. 4C, and shows the electric field distribution during exposure to a moderate X-ray flux rate (e.g., <20 Mcps/mm$^2$). Line 405 shows the electric field distribution during exposure to a high X-ray flux range (e.g., >20 Mcps/mm$^2$, such as >100 Mcps/mm$^2$). At high X-ray flux rates (e.g., >20 Mcps/mm$^2$, such as >100 Mcps/mm$^2$), the reduction of the internal electric field near the anode-side 201 dramatically increases the risetime of the current induced on the anode electrode. As a result, the signal amplitude of the detector may be dramatically reduced, and the pulse-height spectra may show a large shift towards low energies. Eventually, the electric field at the anode-side 201 may collapse to zero, as shown by line 405 in FIG. 5C. In this state, the detector 120 suffers detector polarization, which is a catastrophic loss of performance. The detector 120 is no longer useful in this condition.

Figure 5:
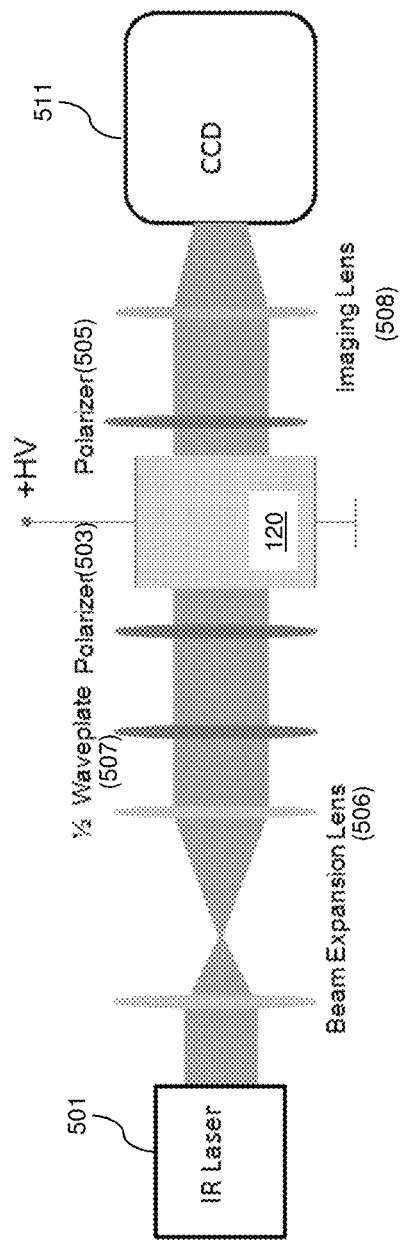
FIG. 5 is a schematic illustration of an apparatus for measuring the internal electric field distribution of a radiation detector.

The phenomenon of anode-side electric field collapse and detector polarization may be measured experimentally using standard Pockel's electric field measurements of X-ray radiation detectors. FIG. 5 schematically illustrates the experimental set-up for measuring the internal electric field distribution of a radiation detector, such as radiation detector 120 shown in FIGS. 1-2C using Pockel's electro-optic effect, which describes the phase changes in polarized light passing through a uniaxial crystal which is under the stress of electric field. The effect is a linear function of applied electric field, which is similar to the effect obtained with optical retarders. A retardation plate introduces a fixed phase shift between the ordinary and extraordinary light rays passing through the plate. A light source 501 (e.g., an IR laser) may be used to direct a light beam at the detector 120 which is biased with a positive voltage (+HV). A pair of polarizers 503, 505 may be used to change in the state of the polarization of the light beam. The laser beam diameter may be about 1 mm and may be expanded to a larger diameter via a lens system 506. The polarization state of the beam may be fixed by a half waveplate 507. The expanded laser beam may pass through the half waveplate 507 to change to a fixed polarization state. The state of polarization of the laser beam may be elliptical or linear and can change as a function of temperature. Thus, the half-waveplate 507 guaranties that the incoming beam for the first polarizer 503 is linearly polarized. The state of the polarized light after passing through the first polarizer 503 and the radiation detector 120 is changed by Pockels effect. The change of state of the polarization can be detected by the effect of the second polarizer 505 on the intensity of incoming light. An optical detector 551, such as a CCD, may record the intensity of the light passing through the second polarizer 505 and the imaging lens 508 as a matrix in which each element has values from 0 to a maximum integer number. The measured intensity is a function of the electric field in the detector 120 and may be expressed as:

$$I = I_0 \sin^2\left(\frac{\sqrt{3}\pi d n_0^3 r_{41}}{2\lambda} E\right),\quad \text{[Eq. 1]}$$

where, I is the recorded intensity when polarizers are in perpendicular position with respect to each other, d is the length, $n_0$ is the index of refraction at wavelength $\lambda$, $r_{41}$ is the linear optical coefficient, and E is electric field. $I_0$ is the intensity of light recorded by the optical detector 551 when both polarizers are in parallel position with respect to each other.

Figure 6:
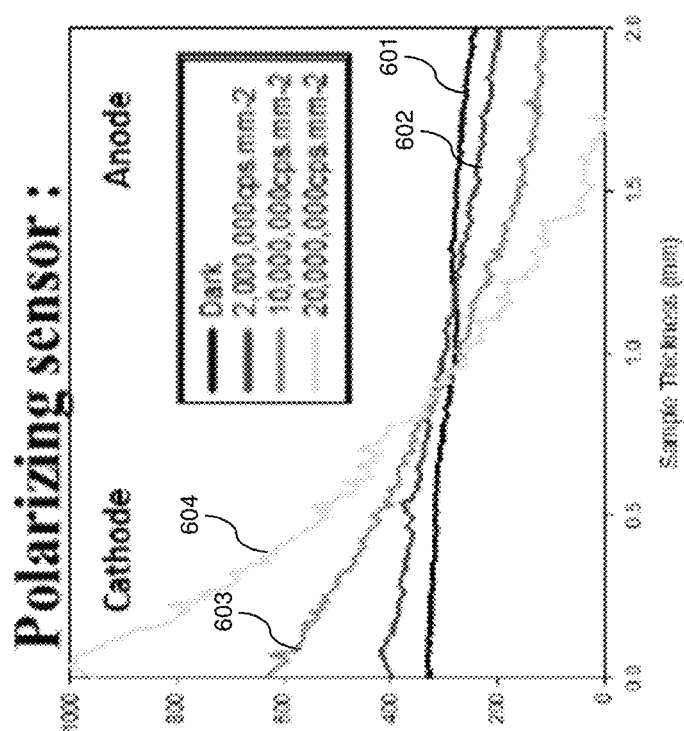
FIG. 6 is a plot showing the internal electric field distribution of an n-type CZT detector measured under different X-ray flux conditions.

FIG. 6 is a plot showing the internal electric field distribution of an n-type CZT detector under different X-ray flux conditions measured using an experimental set-up as shown in FIG. 5. Line 601 shows the electric field distribution under HV bias conditions without X-ray exposure (i.e., no X-ray flux) and demonstrates a negative slope from the cathode-side to the anode-side, which is characteristic of n-type material. Lines 602 and 603 show the electric field distribution under X-ray flux rates of 2 Mcps/mm² and 10 Mcps/mm², respectively. Line 604 shows the electric field distribution under a X-ray flux rate of 20 Mcps/mm². At this flux rate, the detector 120 is completely polarized, and the electric field is reduced to zero near the anode-side of the detector.

A detector 120 that has experienced polarization may eventually recover by, for example, by removing the incident radiation source and waiting a time period on the order of seconds or minutes for excess charge carriers to be removed from the detector and for the internal electric field distribution of the detector to restore to a normal state. However, this is not an ideal solution, particularly when polarization occurs during an imaging scan, and detector polarization may result in significantly longer scan times and/or excess radiation dose. Thus, it would be preferable to avoid the occurrence of detector polarization entirely.

For high flux photon counting based applications, such as CT imaging applications, an important characteristic for the radiation detector 120 is that it should be able to operate under intense and rapidly changing X-ray environments. The detector 120 preferably needs to sustain high fluxes of incoming X-rays of the order of $10^2$ Mcps/mm², while maintaining a short enough charge collection time and temporal stability. Thus, there is a need for radiation detectors that will not undergo polarization during high flux applications.

In various embodiments, an n-type doped semiconductor material for a radiation detector, such as indium doped CZT, may be engineered to contain sufficient p-type compensating defects as to render the semiconductor material a p-type semiconductor material. In particular, by controlling the macroscopic parameters during growth of the single-crystal semiconductor material, the number of intrinsic deep level donor defects in the material may be suppressed and the number of intrinsic deep level acceptor defects present in the material may exceed the total number of extrinsic (i.e., dopant) and intrinsic donor defects present in the material. In various embodiments, the majority of the carrier trap defects in the semiconductor material may be acceptor impurities (which may also be referred to as "acceptor defects" and/or "hole traps"), and thus the material may be a p-type semiconductor material. In various embodiments, an X-ray radiation detector 120 having a p-type semiconductor material substrate 124, such as a p-type but n-type atom doped substrate, such as In-doped CZT material substrate, may operate under higher X-ray flux conditions without undergoing detector polarization.

In one embodiment, the semiconductor (e.g., CZT) growth method may be controlled to intentionally increase the number of intrinsic deep level acceptor defects present in the semiconductor material. In other words, in one embodiment, the growth method may be controlled to intentionally introduce p-type defects into the crystal lattice during growth (e.g., to intentionally grow an imperfect single crystal).

As used herein, a "deep level acceptor defect" may be a defect that creates extra hole energy states that are nearer to the valence band, $E_v$, than to the conduction band, $E_c$, of the host semiconductor material. Referring to the energy diagram of FIG. 3, a deep level acceptor defect may produce hole energy states that are at least 0.01 eV higher (e.g., ≥0.1 eV higher) than the energy of the valence band, $E_v$, of the material. The deep level acceptor defects may be intrinsic defects, meaning that they are not created as a result of an intentional doping with a p-type dopant atoms. Examples of intrinsic deep level acceptor defects in the case of In-doped CZT include, without limitation, cadmium lattice site vacancies, both single and double ionized ($V_{Cd}^-$, $V_{Cd}^{--}$), and indium associate cadmium complexes ($V_{Cd}^{--}$—$In_{Cd}^+$) (i.e., vacancy on the cadmium lattice site associated with indium on the cadmium lattice site).

In various embodiments, a concentration of deep level acceptor defects ($N_{deep\_act}^-$) in the semiconductor material may be greater than a concentration of donor defects, which may include both extrinsic donor defects (e.g., extrinsic n-type dopant atoms) and intrinsic donor defects. Examples of intrinsic donor defects include, without limitation, single and/or double ionized tellurium anti-site defects ($Te_{Cd}^+$, $Te_{Cd}^{++}$), tellurium interstitial defects ($Te_i^+$), single and/or double ionized cadmium interstitial defects ($Cd_i^+$, $Cd_i^{++}$) and single and/or double ionized tellurium vacancy defects ($V_{Te}^+$, $V_{Te}^{++}$).

We define the net atomic doping concentration of the semiconductor material $N_{net}$ to be the difference between the total concentration of acceptors, $N_A$ and the total concentration of donors, $N_D$, i.e., $N_{net}=N_A-N_D$. We also define the net ionized dopant concentration $N_{net}^i$ as the difference between the total concentration of ionized acceptors, $N_A^-$ and the total concentration of ionized donors, $N_D+$, i.e., $N_{net}^i=N_A-N_D+$. In the case of multiply ionized dopants this expression may be generalized accordingly. In various embodiments, a net ionized doping concentration of the semiconductor material, $N_{net}^i$, may be equal to the concentration of deep level acceptor defects ($N_{deep\_act}^-$) minus the concentrations of the deep level donor defects ($N_{deep\_don}^+$) and the shallow level donor defects ($N_{sha\_don}^+$), i.e., $N_{net}=N_{deep\_act}^- - N_{deep\_don}^+ - N_{sha\_don}^+$. The shallow level donor defects into the indium dopant atoms substitutionally located on the cadmium lattice sites. In embodiments, the net ionized dopant concentration of the semiconductor material, $N_{net}^i$, may be less than a critical ionized dopant concentration, $N_{crit}$. In embodiments, the critical ionized dopant concentration, $N_{crit}$, may be less than $10^{12}$ cm$^3$, such as between $5\times10^{10}$ cm$^{-3}$ and $2\times10^{11}$ cm$^{-3}$. This net ionized dopant concentration may depend on the HV bias and be much lower when HV bias is low, i.e., below 10V, which is the situation in which the resistivity of the semiconductor is measured. Accordingly, the net ionized dopant concentration may vary substantially depending upon the HV bias conditions in which it is measured.

In various embodiments, the concentration of extrinsic dopant atoms, such as indium, in the semiconductor material may be between 0.1 and 20 parts per million (ppm), such as between 1 and 8 ppm. In various embodiments, the resistivity of the p-type semiconductor material substrate 124 may range from $5\times10^8$ to $5\times10^{10}$ Ohm-cm, such as from $1\times10^9$ to $2\times10^{10}$ Ohm-cm.

In various embodiments, the mu*tau ($\mu\tau$) product for the semiconductor material may be at least $10^{-4}$ cm$^2$/V (e.g., $\geq 10^{-3}$ cm$^2$/V) for both holes and electrons, where mu ($\mu$) is the mobility (in units of cm$^2$/V*s) of the respective carriers and tau ($\tau$) is the carrier lifetime in seconds. In one embodiment, $\mu\tau$ value for electrons is 5 to 20 times, such as 7 to 15 times, e.g., about 10 times greater than the $\mu\tau$ value for holes in the semiconductor material.

Referring again to FIGS. 1-2C, an embodiment radiation detector 120 comprised of an p-type semiconductor material substrate 124, such as a p-type In-doped CZT material substrate, may be coupled to a high voltage bias power supply 130 such that a high voltage (HV), which may have a negative polarity, may be applied to the cathode-side 203 (e.g., to the cathode 122) of the semiconductor material substrate 124. The anode-side 201 of the semiconductor material substrate 124 may be connected to virtual ground (e.g., connected to a ground in the ASIC 125 through the anodes 128). Upon application of the HV bias voltage, the detector 120 becomes active and will be responsive to incident radiation. At a low HV bias voltage, the measured X-ray photon counts would be low and the electric field may be approximated as the bias voltage (HV) divided by the detector thickness, L, or HV/L. Under those conditions the transit time through the detector would be simply a ratio of distance L and drift velocity mu*HV/L resulting in L$^2$/(mu*HV). Unlike in the case of the n-type detector material described above, in a p-type semiconductor material detector, the depletion effect starts at the anode-side 201 of the detector 120. This is due the fact that the cathode-side 203 "sees" a negative bias voltage (HV) leading to hole accumulation. In contrast, the anode-side 201 of the detector 120 "sees" effectively a positive voltage leading to hole depletion.

As the bias voltage (HV) is increased the active depletion layer increases resulting in a portion of the detector 120 near the anode-side 201 becoming depleted and active, and the remaining portion closest to the cathode-side 203 is not depleted. The bias voltage (HV) in this condition is less than the depletion voltage, HV<$V_{dep}$. As the bias voltage (HV) increases, the active region widens and measured counts under X-ray irradiation should increase. The depletion layer width W can be calculated as:

$$W=\text{sqrt}[2*\varepsilon s/(q*N_{net}^i)*HV] \qquad [\text{Eq. 2}]$$

where $\varepsilon s$ is the semiconductor permittivity, q is the charge of electron and $N_{net}^i$ is the net ionized dopant density. This equation neglects zero voltage depletion layer widths at the cathode and anode, the assumption with less than 1% error under typical bias voltage (HV) conditions.

When the bias voltage (HV) is equal to the depletion voltage, HV=$V_{dep}$, the depletion layer width W becomes equal to the detector thickness L. The depletion voltage may be calculated as:

$$V_{dep}=(qN_{net}^iL^2)/(2*\varepsilon s) \qquad [\text{Eq. 3}]$$

As can be seen from Eq. 3, the $V_{dep}$ value strongly depends on net ionized dopant concentration $N_{net}^i$. Measured counts C above a threshold energy $E_{thresh}$ under X-ray may be proportional to the W value until W reaches L at which point counts reach their maximum value $C_{max}$. This can be expressed as:

$$C/C_{max}=\min(W/L,1) \qquad [\text{Eq. 4}]$$

Figure 7:
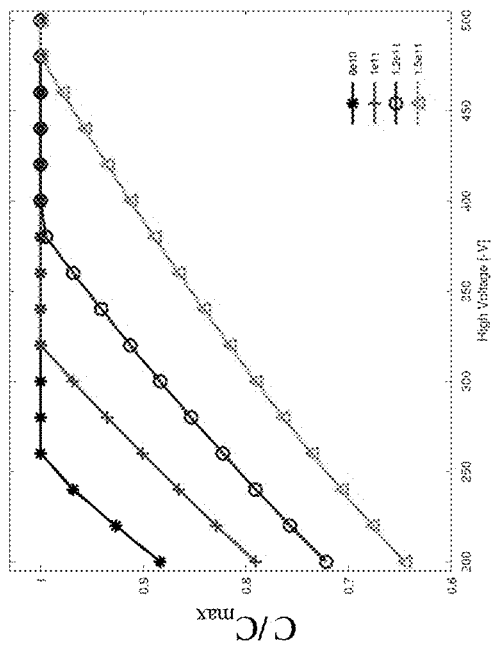
FIG. 7 a plot showing the $C/C_{max}$ ratio as a function of bias voltage for p-type semiconductor material detectors having different net doping concentrations.

The strong dependence of the depletion voltage, $V_{dep}$, on the net ionized dopant concentration, $N_{net}^i$, is illustrated by FIG. 7, which is a plot showing the $C/C_{max}$ ratio as a function of bias voltage (HV) for p-type semiconductor material detectors having different net dopant concentrations, $N_{net}^i$. The illustrated curves show the $C/C_{max}$ ratios for 2 mm-thick p-type CZT radiation detectors having net ionized dopant densities of $N_{net}^i=8\times10^{10}$, $1\times10^{11}$, $1.2\times10^{11}$ and $1.5\times10^{11}$ cm$^{-3}$. The $C/C_{max}$ ratios are expressed as W/L values, where a value of 1 indicates that the detector is fully depleted. As shown in FIG. 7, modest changes (e.g., 20%) in the net ionized dopant concentration may have a significant effect on the measured $C/C_{max}$ curve. For example, the net ionized doping concentration of $8\times10^{10}$ cm$^{-3}$ requires only a 255V bias voltage to fully deplete the detector while a net ionized dopant concentration of $1.5\times10^{11}$ cm$^{-3}$ requires 475V bias voltage to deplete the detector. The sensitivity of $V_{dep}$ to $N_{net}^i$ values indicates that control of the net ionized dopant concentration is an important consideration in CZT detector production.

Figure 8A:
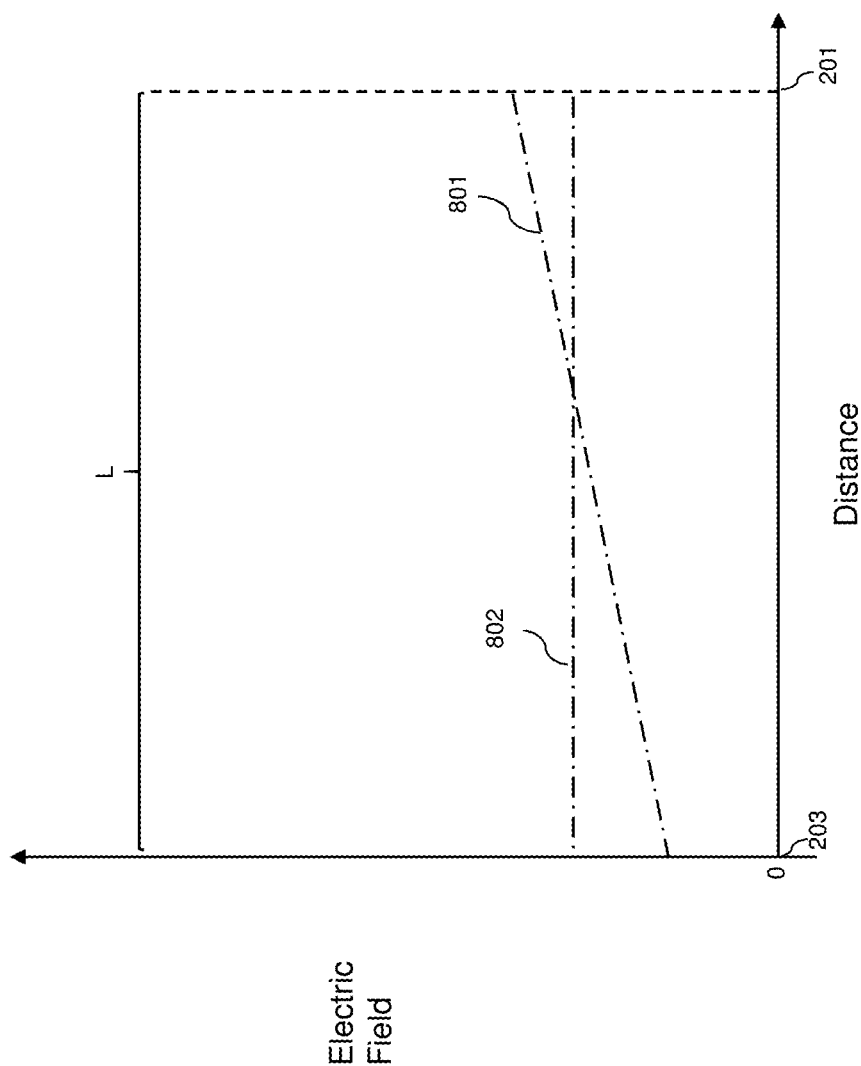
FIG. 8A is a plot schematically illustrating the electric field distribution between the cathode-side and the anode-side of a p-type semiconductor material detector prior to and during an exposure to X-ray radiation.

FIG. 8A is a plot schematically illustrating the electric field distribution between the cathode-side 203 and the anode-side 201 of a p-type semiconductor material detector, such as a p-type In-doped CZT material detector, prior to and during an exposure to X-ray radiation. FIG. 8A is analogous to FIG. 4B described above, and illustrates a number of differences between conventional n-type detector semiconductor materials and a compensated n-doped but p-type semiconductor material according to various embodiments. Dashed line 801 illustrates the electric field distribution prior to X-ray exposure. The bias voltage, HV, is greater than the depletion voltage, $V_{dep}$, such that the detector is fully depleted. As discussed above, in the p-type semiconductor material, the depletion effect starts at the anode-side 201 of the detector and progresses to the cathode-side 203. The electric field distribution has a positive slope, with the highest electric field nearest the anode-side 201, and a relatively lower electric field at the cathode-side 203 of the detector.

Dashed line 802 shows the electric field distribution while the detector is being exposed to moderate-flux X-ray radiation. As in the case of the n-type detectors described above with reference to FIG. 7B, the absorbed X-ray photons generate electron-hole pairs. The electrons drift towards the anode-side 201 while holes drift towards the cathode-side 203 due to the externally applied bias voltage (HV). Similar to the case of the n-type detectors, the trapping of photogenerated holes leads to a positive increase of fixed space charge, which leads to weakening of the electric field at the anode-side 201 while increasing the electric field at the cathode-side 203. However, because the electric field at the anode-side 201 is higher than at the cathode-side 203 prior to the X-ray exposure, the decrease in the electric field at the anode-side 201 and the increase of the electric field at the cathode-side 203 during X-ray irradiation may result in a relatively flat electric field distribution as shown by line 802 in FIG. 8A, which is generally ideal for detector operation.

Figure 8B:
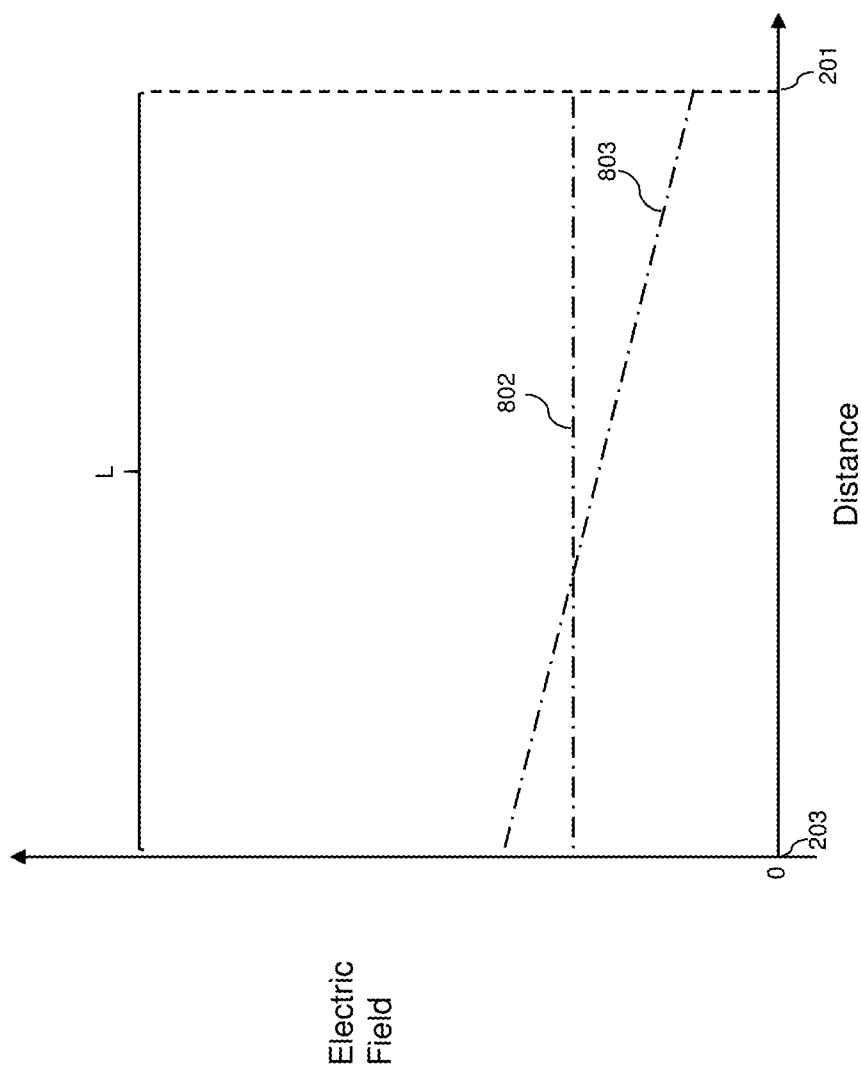
FIG. 8B is a plot schematically illustrating the electric field distribution between the cathode-side and the anode-side of the p-type semiconductor material detector during exposure to different X-ray radiation flux rates.

FIG. 8B is a plot schematically illustrating the electric field distribution between the cathode-side 203 and the anode-side 201 of the p-type semiconductor material detector during exposure to different X-ray radiation flux rates. Line 802 shows the electric field distribution during exposure to a moderate X-ray flux rate (e.g., ≤20 Mcps/mm²), and line 803 shows the electric field distribution during exposure to a high X-ray flux rage (e.g., >20 Mcps/mm², such as >100 Mcps/mm²). As in the case of n-type semiconductor material detectors described above with reference to FIG. 4C, when the detector is exposed to high-flux X-ray radiation, the continued charge accumulation at the cathode-side 203 and reduced carrier drift speeds may cause the electric field near the anode-side 201 of the detector to further decrease, while the electric field at the cathode-side 203 may continue to increase. However, because of the relatively higher electric field at the anode-side 201 at the onset of X-ray exposure, as shown by line 801 in FIG. 8A, the electric field near the anode-side 201 does not decrease to zero during high-flux operation. Accordingly, detector polarization does not occur, and the detector may continue to operate properly under high-flux conditions. In various embodiments, a p-type semiconductor detector according to various embodiments may operate under sustained X-ray flux rates of at least about 100 Mpcs/mm², such as at least 250 Mpcs/mm², including 600 Mpcs/mm² or more, without experiencing detector polarization.

Under extremely high-flux conditions, eventually the electric field at the anode-side 201 will collapse to zero and the detector will become polarized and cease to operate properly. However, a p-type semiconductor material detector, such as a p-type In-doped CZT detector as described above, may significantly delay the onset of detector polarization relative to conventional n-type semiconductor material detectors. In some cases, a p-type semiconductor material detector may only become polarized under conditions that are beyond the intended operating range of the imaging system (e.g., a spectral CT scanner) in which the detector is incorporated, thus rendering the p-type semiconductor material detector effectively immune to detector polarization for the entire intended operating X-ray photon flux range of the detector.

Figure 9:
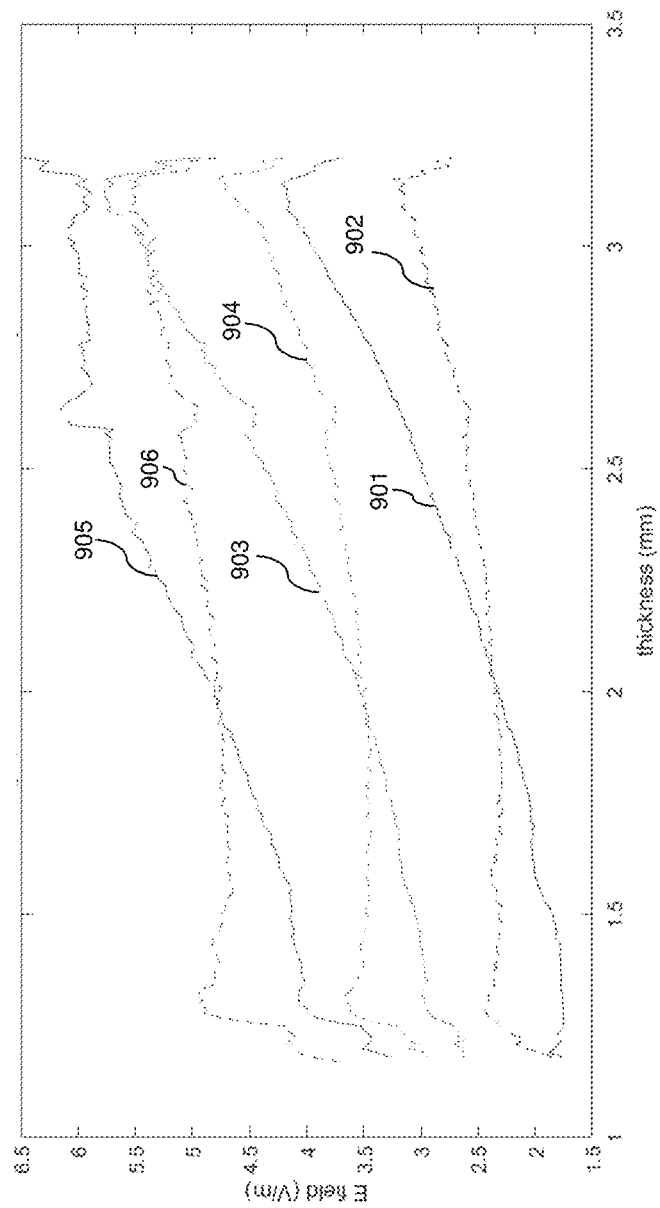
FIG. 9 is a plot showing the internal electric field distribution of a p-type CZT detector measured under different bias voltage (HV) conditions.

FIG. 9 is a plot showing the internal electric field distribution of a p-type CZT detector under different bias voltage (HV) conditions measured using an experimental set-up as shown in FIG. 5. The cathode-side 203 of the detector is on the left (at ~1.2 mm) and the anode-side 201 is on the right (at ~3.2 mm). Solid lines 901, 903 and 905 show the detector under no X-ray exposure at different bias voltages (HV). Line 901 shows the detector at 500V HV, line 903 shows the detector at 700V HV, and line 905 shows the detector at 900V HV. As shown in FIG. 9, each of the lines 902, 904, 906 has a positive slope of electric field values from the cathode-side to the anode-side, which is characteristic of p-type material. Dashed lines 902, 904 and 906 show the detectors while exposed X-rays under a 25 mA X-ray tube current. Each of the dashed lines 902, 904 and 906 show some degradation of the electric field at the anode-side of the detector. However, under all three bias voltage conditions, the sensor does not approach a polarization condition and shows proper counting behavior up to a maximum tested value of 250 Mcps/mm². The amount of degradation of the electric field at anode-side of the detector does depend in part on the bias voltage applied to the detector. In particular, the relative degradation of the anode-side electric field may be smaller at higher bias voltages (HV). Thus, in addition to the use of a p-type semiconductor material as described above, the use of relatively higher bias voltages may further reduce the occurrence of detector polarization.

According to one embodiment illustrated in FIGS. 1-2C, an ionizing radiation detector 120 includes a p-type semiconductor single crystal substrate 124 having first and second major planar opposing surfaces 203, 201, wherein the p-type semiconductor single crystal substrate 124 is doped with n-type dopant atoms, and wherein a concentration of deep level acceptor defects is greater than a concentration of the n-type dopant atoms in the p-type semiconductor single crystal substrate 124. The detector 120 also includes a cathode electrode 122 on the first major planar opposing surface 203 of the p-type semiconductor single crystal substrate 124, and a plurality of anodes electrodes 128 on the second major planar opposing surface 201 of the p-type semiconductor single crystal substrate 124.

In one embodiment, the p-type semiconductor single crystal substrate 124 is doped with the n-type dopant atoms at a concentration between 0.1 parts per million (ppm) and 20 parts per million (ppm), such as 1 ppm to 12 ppm.

In one embodiment, the p-type semiconductor single crystal substrate 124 includes a II-VI semiconductor material, such as a cadmium telluride-based semiconductor material. In one embodiment, the p-type semiconductor single crystal substrate 124 comprises cadmium zinc telluride (CZT) including 6-14 at. % of zinc. In one embodiment, the n-type dopant atoms comprise indium atoms.

In one embodiment, the concentration of deep level acceptor defects in the p-type semiconductor single crystal substrate 124 is greater than a concentration of extrinsic and intrinsic donor defects in the p-type semiconductor single crystal substrate 124.

In one embodiment, the deep level acceptor defects comprise at least one of single ionized cadmium vacancies ($V_{Cd}^-$) double ionized cadmium vacancies ($V_{Cd}^{--}$) or indium associate cadmium complexes ($V_{Cd}^{--}$—$In_{Cd}^+$), the extrinsic donor defects comprise the n-type dopant atoms, and the intrinsic donor defects comprise at least one of single or double ionized tellurium anti-site defects ($Te_{Cd}^+$, $Te_{Cd}^{++}$), tellurium interstitial defects (Te$_i^+$), single or double ionized cadmium interstitial defects (Cd$_i^+$, Cd$_i^{++}$) or single or double ionized tellurium vacancy defects (V$_{Te}^+$, V$_{Te}^{++}$).

In one embodiment, the concentration of ionized deep level acceptor defects in the p-type semiconductor single crystal substrate 124 exceeds the concentration of extrinsic and intrinsic ionized donor defects in the p-type semiconductor single crystal substrate 124 by a net ionized doping concentration, N$_{net}^i$, that is between $10^7$ cm$^{-3}$ and $10^{12}$ cm$^{-3}$. In one embodiment, the net ionized doping concentration, N$_{net}^i$, of the p-type semiconductor single crystal substrate 124 is between $5 \times 10^{10}$ and $2 \times 10^{11}$ cm$^{-3}$, as determined from depletion voltage or Pockels measurement of the internal electric field. In another embodiment, the net ionized doping concentration, N$_{net}^i$, of the p-type semiconductor single crystal substrate 124 is between $10^7$ and $10^8$ cm$^{-3}$, as determined from resistivity measurement.

In one embodiment, a mu*tau (PT) product for the p-type semiconductor single crystal substrate is at least $10^{-4}$ cm/V for both holes and electrons. In one embodiment, the μτ value for electrons is 5 to 20 times greater than the μτ value for holes.

In one embodiment, the p-type semiconductor single crystal substrate 124 comprises (111)A and (111)B first and second major planar opposing surfaces. In one embodiment, the ionizing radiation detector 120 comprises a photon counting computed tomography detector which is configured to detect X-ray photons at flux rates of at least 100 million, such as at least 600 million counts per second per square millimeter (Mcps/mm$^2$) without occurrence of detector polarization.

In an embodiment, a computed tomography imaging system 100 includes the ionizing radiation detector 120, the X-ray source 110 and a power supply 130 configured to generate an electric field in the p-type semiconductor single crystal substrate 124. In one embodiment, a method of operating the computed tomography imaging system 100 includes applying a bias voltage between 10V and 2000V, such as between 250 C and 1200V to the cathode electrode 122 to deplete carriers in the p-type semiconductor single crystal substrate 124 between the first major opposing surface 203 and the second major opposing surface 201.

In an embodiment, a distribution of the magnitude of the electric field generated in the p-type semiconductor single crystal substrate 124 between the first major opposing surface 203 and the second major opposing surface 201 has a positive slope when the radiation detector 120 is not exposed to ionizing radiation. In an embodiment, the ionizing radiation detector 120 detects X-ray photons from the X-ray source 110 at flux rates of at least 100 million, such as at least 600 million counts per second per square millimeter (Mcps/mm$^2$) without occurrence of detector polarization.

The detectors of the present embodiments may be implemented in systems used for medical imaging, such as CT imaging, as well as for non-medical imaging applications, such as industrial inspection applications.

While the disclosure has been described in terms of specific embodiments, it is evident in view of the foregoing description that numerous alternatives, modifications and variations will be apparent to those skilled in the art. Each of the embodiments described herein may be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. An ionizing radiation detector, comprising:
a p-type semiconductor single crystal substrate comprising first and second major planar opposing surfaces, wherein the p-type semiconductor single crystal substrate is doped with n-type dopant atoms, and wherein a concentration of deep level acceptor defects is greater than a concentration of the n-type dopant atoms in the p-type semiconductor single crystal substrate;
a cathode electrode on the first major planar opposing surface of the p-type semiconductor single crystal substrate; and
a plurality of anode electrodes on the second major planar opposing surface of the p-type semiconductor single crystal substrate,
wherein:
the p-type semiconductor single crystal substrate is doped with the n-type dopant atoms at a concentration between 0.1 parts per million (ppm) and 20 parts per million (ppm);
the p-type semiconductor single crystal substrate comprises a II-VI semiconductor material;
the II-VI semiconductor material comprises cadmium zinc telluride (CZT) comprising 6-14 at. % of zinc;
the n-type dopant atoms comprise indium atoms, and resistivity of the p-type semiconductor single crystal substrate ranges from $5 \times 10^8$ to $5 \times 10^{10}$ Ohm-cm;
the concentration of deep level acceptor defects in the p-type semiconductor single crystal substrate is greater than a concentration of extrinsic and intrinsic donor defects in the p-type semiconductor single crystal substrate;
the deep level acceptor defects comprise at least one of single ionized cadmium vacancies (V$_{Cd}^-$), double ionized cadmium vacancies (V$_{Cd}^{--}$) or indium associate cadmium complexes (V$_{Cd}^{--}$—In$_{Cd}^+$);
the extrinsic donor defects comprise the n-type dopant atoms; and
the intrinsic donor defects comprise at least one of single or double ionized tellurium anti-site defects (Te$_{Cd}^+$, Te$_{Cd}^{++}$), tellurium interstitial defects (Te$_i^+$), single or double ionized cadmium interstitial defects (Cd$_i^+$, Cd$_i^{++}$), or single or double ionized tellurium vacancy defects (V$_{Te}^+$, V$_{Te}^{++}$).

2. The ionizing radiation detector of claim 1, wherein the concentration of ionized deep level acceptor defects in the p-type semiconductor single crystal substrate exceeds the concentration of extrinsic and intrinsic ionized donor defects in the p-type semiconductor single crystal substrate by a net ionized dopant concentration, N$_{net}^i$, that is between $10^7$ cm$^{-3}$ and $10^{12}$ cm$^{-3}$.

3. The ionizing radiation detector of claim 2, wherein the net ionized dopant concentration, N$_{net}^i$, of the p-type semiconductor single crystal substrate is between $10^7$ and $10^8$ cm$^{-3}$ as determined from resistivity measurement or between $5 \times 10^{10}$ cm$^{-3}$ and $2 \times 10^{11}$ cm$^{-3}$ as determined from depletion voltage or Pockels measurement of the internal electric field.

4. The ionizing radiation detector of claim 1, wherein a mu*tau (μτ) product for the p-type semiconductor single crystal substrate is at least $10^{-4}$ cm/V for both holes and electrons.

5. The ionizing radiation detector of claim 4, wherein the µτ value for electrons is 5 to 20 times greater than the µτ value for holes.

6. The ionizing radiation detector of claim 1, wherein the p-type semiconductor single crystal substrate comprises (111)A and (111B) first and second major planar opposing surfaces.

7. The ionizing radiation detector of claim 1, wherein the ionizing radiation detector comprises a photon counting computed tomography detector which is configured to detect X-ray photons at flux rates of at least 100 million counts per second per square millimeter (Mcps/mm$^2$) without occurrence of detector polarization.

8. The ionizing radiation detector of claim 7, wherein the detector is configured to detect X-ray photons at flux rates of at least 600 Mcps/mm$^2$ without the occurrence of detector polarization.

9. A computed tomography imaging system, comprising:
   ionizing radiation detector of claim 1;
   an X-ray source; and
   a power supply configured to generate an electric field in the p-type semiconductor single crystal substrate.

10. A method of operating the computed tomography imaging system of claim 9, comprising applying a bias voltage between 10V and 2000V to the cathode electrode to deplete carriers in the p-type semiconductor single crystal substrate between the first major opposing surface and the second major opposing surface.

11. The method of claim 10, wherein the bias voltage is between 250V and 1200V.

12. The method of claim 10, wherein a distribution of the magnitude of the electric field generated in the p-type semiconductor single crystal substrate between the first major opposing surface and the second major opposing surface has a positive slope when the radiation detector is not exposed to ionizing radiation.

13. The method of claim 10, wherein the ionizing radiation detector detects X-ray photons from the X-ray source at flux rates of at least 100 million counts per second per square millimeter (Mcps/mm$^2$) without occurrence of detector polarization.

14. The method of claim 10, wherein the ionizing radiation detector detects X-ray photons from the X-ray source at flux rates of at least 600 million counts per second per square millimeter (Mcps/mm$^2$) without occurrence of detector polarization.

* * * * *